US012324266B2

(12) United States Patent
Takeda et al.

(10) Patent No.: US 12,324,266 B2
(45) Date of Patent: Jun. 3, 2025

(54) SOLID-STATE IMAGING DEVICE AND ELECTRONIC DEVICE (71) Applicant: SONY SEMICONDUCTOR SOLUTIONS CORPORATION, Kanagawa (JP)

(72) Inventors: Ikumi Takeda, Kanagawa (JP); Takuro Murase, Kanagawa (JP)

(73) Assignee: Sony Semiconductor Solutions Corporation, Kanagawa (JP)

(*) Notice: Subject to any disclaimer, the term of this patent is extended or adjusted under 35 U.S.C. 154(b) by 294 days.

(21) Appl. No.: 17/794,051

(22) PCT Filed: Dec. 2, 2020

(86) PCT No.: PCT/JP2020/044915
§ 371 (c)(1),
(2) Date: Jul. 20, 2022

(87) PCT Pub. No.: WO2021/157174
PCT Pub. Date: Aug. 12, 2021

(65) Prior Publication Data
US 2023/0047442 A1 Feb. 16, 2023

(30) Foreign Application Priority Data
Feb. 6, 2020 (JP) .................................. 2020-018770

(51) Int. Cl.
H01L 27/14 (2006.01)
H10F 39/00 (2025.01)

(52) U.S. Cl.
CPC ....... H10F 39/807 (2025.01); H10F 39/8023 (2025.01); H10F 39/8057 (2025.01)

(58) Field of Classification Search
CPC ......... H01L 27/14603; H01L 27/14605; H01L 27/14623; H01L 27/14654; H01L 27/14672
See application file for complete search history.

(56) References Cited

U.S. PATENT DOCUMENTS

2012/0025059 A1* 2/2012 Kawashima ...... H01L 27/14687
257/435
2016/0049430 A1 2/2016 Nomura
2017/0338265 A1 11/2017 Yoshiba et al.

FOREIGN PATENT DOCUMENTS

CN 102446936 A 5/2012
CN 105190890 A 12/2015
(Continued)

OTHER PUBLICATIONS

International Search Report and Written Opinion prepared by the Japan Patent Office on Feb. 12, 2021, for International Application No. PCT/JP2020/044915, 2 pgs.

Primary Examiner — Kevin K Pyo
(74) Attorney, Agent, or Firm — Sheridan Ross PC (57) ABSTRACT A solid-state imaging device capable of weakening incident light that passes through an effective pixel region and enters an optical black pixel region. Among a plurality of straight groove portions constituting a trench portion, a first straight groove portion is formed at a boundary between an effective pixel region and an optical black pixel region (OPB pixel region), a plurality of second straight groove portions are formed in the OPB pixel region and parallel to the boundary in a plan view, and a third straight groove portion is formed between photoelectric conversion units in the effective pixel region, a specific straight groove portion, the specific straight groove portion being the first groove portion and/or being one or more of the plurality of second straight groove portions, has a different shape from the third straight groove (Continued)

portion, and a light shielding material is embedded in the specific straight groove portion.

8 Claims, 9 Drawing Sheets

(56) References Cited

FOREIGN PATENT DOCUMENTS

| | | |
|---|---|---|
| CN | 110752227 A | 2/2020 |
| JP | 2008103472 A | 5/2008 |
| JP | 2008-153250 | 7/2008 |
| JP | 2013-211413 | 10/2013 |
| JP | 2019012739 A | 1/2019 |
| KR | 20150135265 A | 12/2015 |
| TW | 201515246 A | 4/2015 |
| WO | WO 2014/156933 | 10/2014 |
| WO | WO 2016/114154 | 7/2016 |
| WO | WO 2019/131122 | 7/2019 |

* cited by examiner

SOLID-STATE IMAGING DEVICE AND ELECTRONIC DEVICE

CROSS REFERENCE TO RELATED APPLICATIONS

This application is a national stage application under 35 U.S.C. 371 and claims the benefit of PCT Application No. PCT/JP2020/044915, having an international filing date of 2 Dec. 2020, which designated the United States, which PCT application claimed the benefit of Japanese Patent Application No. 2020-018770, filed 6 Feb. 2020, the entire disclosures of each of which are incorporated herein by reference.

TECHNICAL FIELD

The present technology relates to a solid-state imaging device and an electronic device.

BACKGROUND ART

Conventionally, a solid-state imaging device having an effective pixel region and an optical black pixel region (hereinafter also referred to as an "OPB pixel region") that is adjacent to the effective pixel region and has a light reception surface side shielded by a light shielding film has been proposed (for example, see PTL 1). The solid-state imaging device described in PTL 1 acquires a reference signal at an optical black level using pixels in the OPB pixel region.

CITATION LIST

Patent Literature

[PTL 1]
JP 2013-211413A

SUMMARY

Technical Problem

Incidentally, because incident light incident on the effective pixel region is inclined so as to travel toward the OPB pixel region near a boundary between the effective pixel region and the OPB pixel region, the incident light passes through the effective pixel region and enters the OPB pixel region. Therefore, pixels that are used for acquisition of the reference signal (hereinafter also referred to as "OPB pixels") need to be sufficiently separated from the boundary between the effective pixel region and the OPB pixel region. Therefore, it is necessary to arrange ineffective pixels of which pixel signals are not used, between the effective pixel region and the OPB pixels. There were about 10 to 20 rows of ineffective pixels. Accordingly, the OPB pixel region is expanded, a chip area is expanded, and a manufacturing cost is increased. Alternatively, it is necessary to reduce the effective pixel region by an amount of expansion of the OPB pixel region.

An object of the present disclosure is to provide a solid-state imaging device and an electronic device capable of weakening incident light that passes through an effective pixel region and enters an optical black pixel region.

Solution to Problem

A solid-state imaging device of the present disclosure includes (a) a pixel region formed on a substrate and including a plurality of photoelectric conversion units arranged in an array pattern; and (b) a pixel separation portion including a trench portion formed in a grid pattern between the photoelectric conversion units, wherein (c) the pixel region is partitioned into an effective pixel region including the photoelectric conversion units for obtaining a pixel signal corresponding to incident light, and an optical black pixel region adjacent to the effective pixel region, the optical black pixel region including a light reception surface side covered with a light shielding film, and the photoelectric conversion unit for obtaining a reference signal at an optical black level, and (d) among a plurality of straight groove portions constituting the trench portion, a first straight groove portion is formed at a boundary between the effective pixel region and the optical black pixel region, a plurality of second straight groove portions are formed in the optical black pixel region and parallel to the boundary in a plan view, and a third straight groove portion is formed between the pixels in the effective pixel region, a specific straight groove portion, the specific straight groove portion being the first straight groove portion and/or being one or more of the plurality of second straight groove portions, has a different shape from the third straight groove portion, and a light shielding material is embedded in the specific straight groove portion.

Further, an electronic device of the present disclosure includes (a) a solid-state imaging device including a pixel region formed on a substrate and including a plurality of photoelectric conversion units arranged in an array pattern, and a pixel separation portion including a trench portion formed in a grid pattern between the photoelectric conversion units, the pixel region being partitioned into an effective pixel region including the photoelectric conversion units for obtaining a pixel signal corresponding to incident light, and an optical black pixel region adjacent to the effective pixel region, the optical black pixel region including a light reception surface side covered with a light shielding film, and the photoelectric conversion unit for obtaining a reference signal at an optical black level, and among a plurality of straight groove portions constituting the trench portion, a first straight groove portion is formed at a boundary between the effective pixel region and the optical black pixel region, a plurality of second straight groove portions are formed in the optical black pixel region and parallel to the boundary in a plan view, and a third straight groove portion is formed between the pixels in the effective pixel region, a specific straight groove portion, the specific straight groove portion being the first straight groove portion and/or being one or more of the plurality of second straight groove portions, has a different shape from the third straight groove portion, and a light shielding material is embedded in the specific straight groove portion; (b) an optical lens configured to form an image of image light from a subject on an imaging surface of the solid-state imaging device; and (c) a signal processing circuit configured to perform signal processing on a signal output from the solid-state imaging device.

DESCRIPTION OF EMBODIMENTS

Hereinafter, an example of a solid-state imaging device 1 and an electronic device according to embodiments of the present disclosure will be described with reference to FIGS. 1 to 7. The embodiments of the present disclosure will be described in the following order. The present disclosure is not limited to the following examples. Further, effects described in the present specification are exemplary and not limited, and there may be other effects.

1. First embodiment: Solid-state imaging device
1-1 Overall configuration of solid-state imaging device
1-2 Configuration of main portions
2. Second embodiment: Solid-state imaging device
2-1 Configuration of main portions
2-2 Modification example
3. Example of application to electronic device

1. First Embodiment: Solid-State Imaging Device

[1-1 Overall Configuration of Solid-State Imaging Device]

Figure 1:
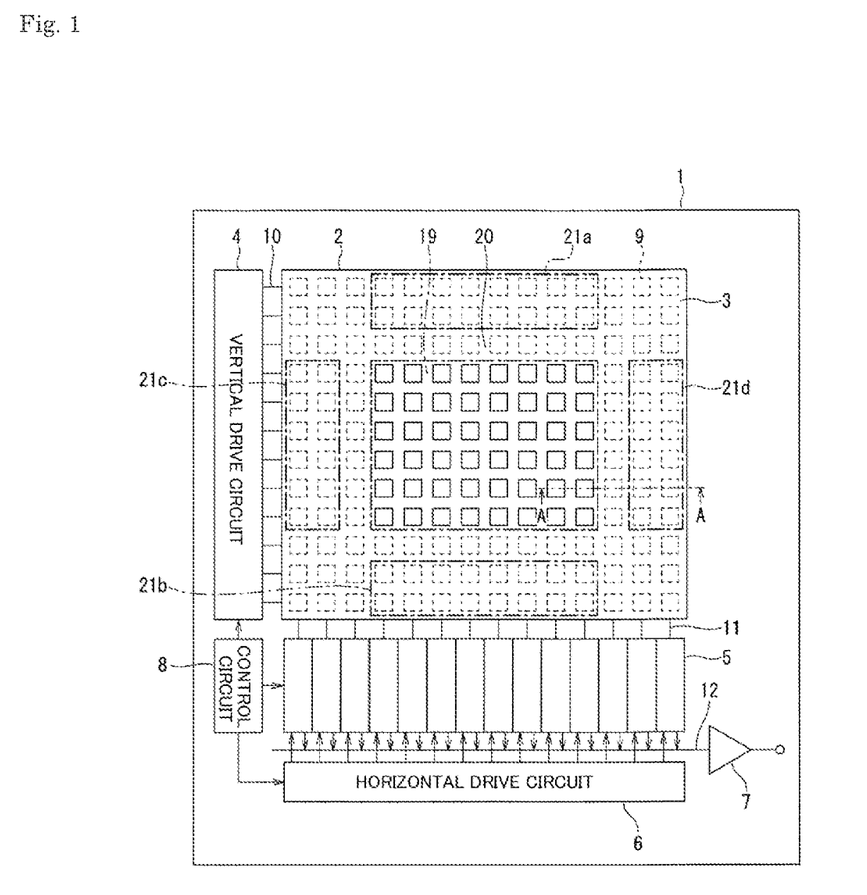
FIG. 1 is a diagram illustrating an overall configuration of a solid-state imaging device according to a first embodiment.

A solid-state imaging device 1 according to a first embodiment of the present disclosure will be described. FIG. 1 is a schematic configuration diagram illustrating the entire solid-state imaging device 1 according to the first embodiment of the present disclosure.

Figure 7:
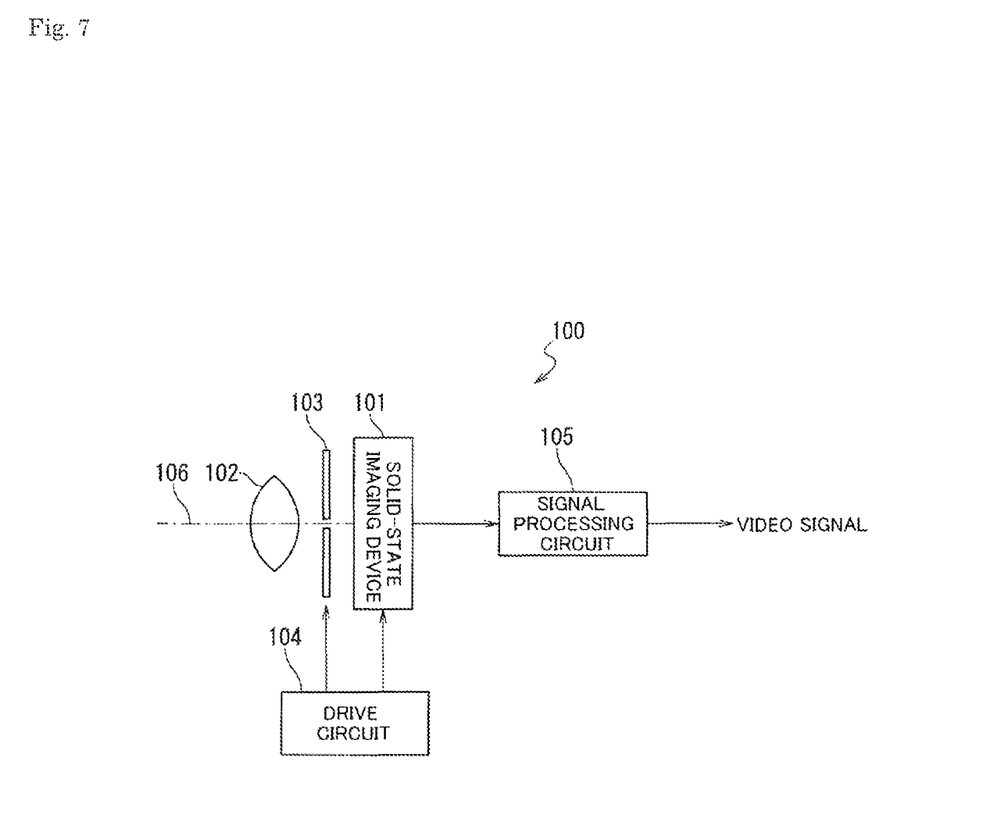
FIG. 7 is a diagram illustrating an example of a schematic configuration of an electronic device.

The solid-state imaging device 1 in FIG. 1 is a back-illuminated complementary metal oxide semiconductor (CMOS) image sensor. As illustrated in FIG. 7, the solid-state imaging device 1 (101) captures image light (incident light 106) from a subject through an optical lens 102, and converts an amount of the incident light 106 whose image is formed on an imaging surface into an electrical signal in units of pixels, and outputs the electrical signal as a pixel signal.

As illustrated in FIG. 1, the solid-state imaging device 1 of the first embodiment includes a substrate 2, a pixel region 3, a vertical drive circuit 4, column signal processing circuits 5, a horizontal drive circuit 6, an output circuit 7, and a control circuit 8.

The pixel region 3 includes a plurality of pixels 9 arranged in a two-dimensional array pattern on the substrate 2. The pixel 9 includes a photoelectric conversion unit 17 illustrated in FIGS. 2A and 2B, and a plurality of pixel transistors (not illustrated). As the plurality of pixel transistors, for example, four transistors such as a transfer transistor, a reset transistor, a selection transistor, and an amplifier transistor can be adopted. Further, for example, three transistors other than the selection transistor may be used.

The vertical drive circuit 4 is configured of, for example, a shift register, selects a desired pixel drive wiring 10, supplies a pulse for driving the pixel 9 to the selected pixel drive wiring 10, and drives the respective pixels 9 in units of rows. That is, the vertical drive circuit 4 selectively scans the respective pixels 9 in the pixel region 3 sequentially in a vertical direction in units of rows, and supplies pixel signals based on signal charge generated according to the amount of received light in the photoelectric conversion units 17 of the respective pixels 9 to the column signal processing circuits 5 through vertical signal lines 11.

The column signal processing circuit 5 is arranged in each column of the pixel 9, for example, and performs, for each pixel array, signal processing such as noise removal on signals output from the pixels 9 for one row. For example, the column signal processing circuit 5 performs signal processing such as a correlated double sampling (CDS) for removing fixed pattern noise specific to the pixel, and analog digital (AD) conversion.

The horizontal drive circuit 6 is configured of, for example, a shift register, and sequentially outputs horizontal scanning pulses to the column signal processing circuits 5, selects the column signal processing circuits 5 in order, and causes pixel signals subjected to the signal processing to be output from the respective column signal processing circuits 5 to the horizontal signal line 12.

The output circuit 7 performs signal processing on the pixel signals sequentially supplied from the respective column signal processing circuits 5 through the horizontal signal line 12, and outputs resultant pixel signals. As the signal processing, for example, buffering, optical black level adjustment, column variation correction, various digital signal processing, and the like can be adopted. As the optical black level adjustment, for example, processing for subtracting a reference signal at an optical black level obtained from the pixel 9 of the optical black pixel region 20 from the pixel signal obtained from the pixel 9 of the effective pixel region 19 to correct a black level of the pixel signal to "0" can be used.

The control circuit 8 generates a clock signal or a control signal that serves as a reference for operations of the vertical drive circuit 4, the column signal processing circuit 5, the horizontal drive circuit 6, and the like, on the basis of a vertical synchronization signal, a horizontal synchronization signal, and a master clock signal. The control circuit 8 outputs the generated clock signal or control signal to the vertical drive circuit 4, the column signal processing circuit 5, the horizontal drive circuit 6, and the like.

[1-2 Configuration of Main Portions]

Figure 2A:
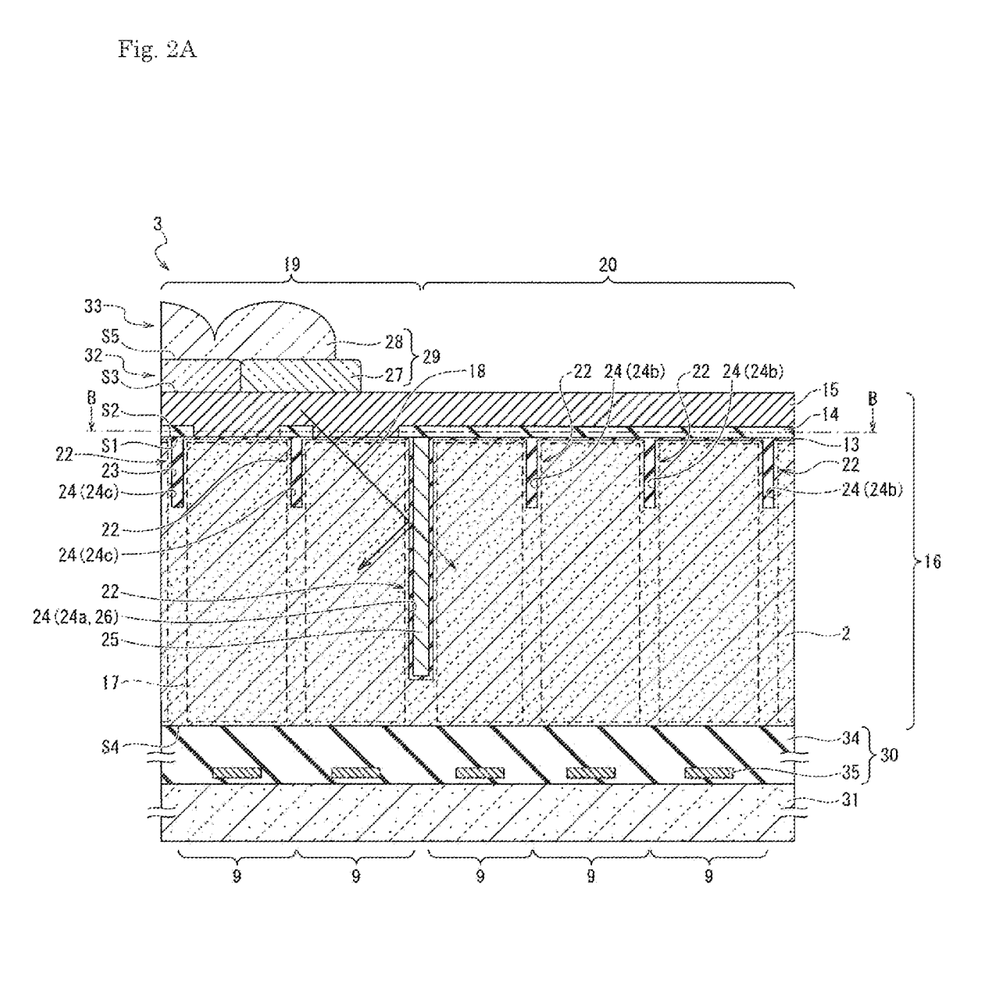
FIG. 2A is a diagram illustrating a cross-sectional configuration of a pixel region when taken along a line A-A of FIG. 1.
Figure 2B:
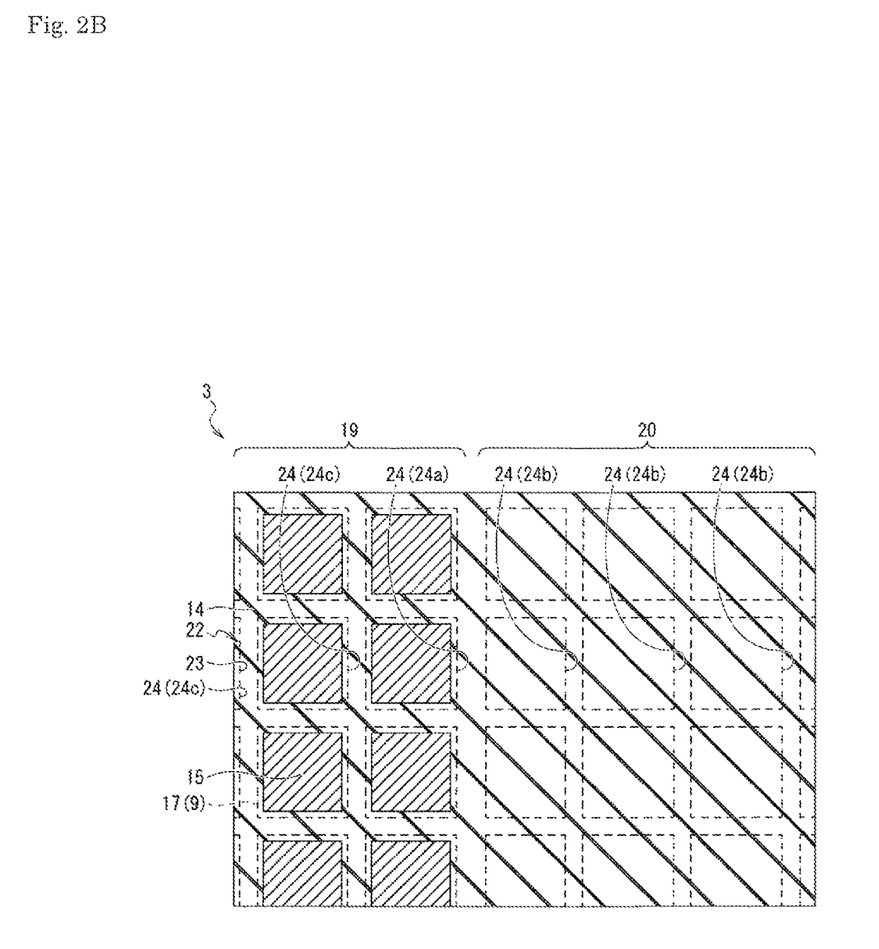
FIG. 2B is a diagram illustrating a cross-sectional configuration of a pixel region when taken along a line B-B of FIG. 2A.

Next, a detailed structure of the solid-state imaging device 1 of FIG. 1 will be described. FIG. 2A is a diagram illustrating a cross-sectional configuration of the pixel region 3 of the solid-state imaging device 1. FIG. 2B is a diagram illustrating a planar configuration of the substrate 2 when taken along a line B-B of FIG. 2A. In FIGS. 2A and 2B, a back-illuminated CMOS image sensor (a CMOS type solid-state imaging device) is used as the solid-state imaging device 1.

The solid-state imaging device 1 of the first embodiment includes a light reception layer 16 in which the substrate 2, an insulating film 13, a light shielding film 14, and a flattening film 15 are stacked in this order, as illustrated in FIGS. 2A and 2B.

The substrate 2 is configured of, for example, a semiconductor substrate made of silicon (Si), and forms the pixel region 3 illustrated in FIG. 1. The plurality of pixels 9 including a plurality of photoelectric conversion units 17 formed on the substrate 2, that is, a plurality of photoelectric conversion units 17 embedded in the substrate 2 are arranged in a two-dimensional array pattern in the pixel region 3, as illustrated in FIGS. 2A and 2B. In the photoelectric conversion unit 17, signal charge corresponding to an amount of incident light 18 is generated, and the generated signal charge is accumulated.

Further, the pixel region 3 is partitioned into the effective pixel region 19, and the optical black pixel region 20 (hereinafter also referred to as an "OPB pixel region 20"), as illustrated in FIG. 1. The effective pixel region 19 is a region in which the photoelectric conversion unit 17 for obtaining a pixel signal corresponding to the incident light 18 is formed. Further, the OPB pixel region 20 is a region that is adjacent to the effective pixel region 19, that has a light reception surface side covered with the light shielding film 14, and in which the photoelectric conversion units 17 for obtaining an optical black level pixel signal (hereinafter also referred to as a "reference signal") are formed. FIG. 1 illustrates a configuration in which the effective pixel region 19 is located at a center of the pixel region 3, and the OPB pixel region 20 is located at a peripheral portion of the pixel region 3.

When the OPB pixel region 20 is located in the peripheral portion of the pixel region 3, a plurality of pixel array columns 21a arranged parallel to an upper side in a plan view at a position away from an upper side of the effective pixel region 19 among the pixels 9 in the OPB pixel region 20, a plurality of pixel array columns 21b arranged parallel to a lower side in a plan view at a position away from a lower side of the effective pixel region 19, a plurality of pixel array columns 21c arranged parallel to a left side in a plan view at a position away from a left side of the effective pixel region 19, and a plurality of pixel array columns 21d arranged parallel to a right side in a plan view at a position away from a right side of the effective pixel region 19 can be adopted as the pixels 9 (OPB pixels 9) used for acquisition of the reference signal at an optical black level.

Further, each photoelectric conversion unit 17 is physically separated by a pixel separation portion 22. The pixel separation portions 22 are formed in a grid pattern so as to surround the respective photoelectric conversion units 17. The pixel separation portion 22 includes a trench portion 23 (a groove portion) formed in a depth direction from a surface (hereinafter also referred to as a "back surface S1") of the substrate 2 on the insulating film 13 side. That is, the trench portion 23 is formed between the adjacent photoelectric conversion units 17 on the back surface S1 side of the substrate 2. Further, the trench portion 23 is formed in a grid pattern so as to surround the respective photoelectric conversion units 17, similar to the pixel separation portion 22.

Further, a straight groove portion 24 formed at a boundary between the effective pixel region 19 and the OPB pixel region 20 (hereinafter also referred to as a "first straight groove portion 24a") among the plurality of straight groove portions 24 constituting the trench portion 23 differs in shape from the straight groove portion 24 formed between the photoelectric conversion units 17 in the effective pixel region 19. Specifically, a depth of the first straight groove portion 24a is larger than that of the straight groove portion 24 (hereinafter also referred to as a "third straight groove portion 24c") arranged between the pixels 9 in the effective pixel region 19. Further, a side wall surface and a bottom surface of the first straight groove portion 24a are covered with the insulating film 13 that covers the back surface S1 side of the substrate 2. A film thickness of the insulating film 13 is a uniform film thickness in which the inside of the first straight groove portion 24a is not completely embedded in order to form a space in the first straight groove portion 24a.

Further, a light shielding material 25 is embedded in the space surrounded by the insulating film 13 in the first straight groove portion 24a. As the light shielding material 25, a metal such as aluminum (Al), tungsten (W), or copper (Cu) can be adopted. It is possible to enhance a light shielding property by using the aluminum, the tungsten, and the copper. Thus, the depth of the first straight groove portion 24a is made larger than the depth of the third straight groove portion 24c, and the light shielding material 25 is embedded in the first straight groove portion 24a, making it possible to weaken the incident light 18 entering the OPB pixel region 20 through a deep portion of the effective pixel region 19 (substrate 2) in the incident light 18 that is incident on the effective pixel region 19, passes through the effective pixel region 19, and enters the OPB pixel region 20 using the pixel separation portion 22 (the light shielding material 25) configured by the first straight groove portion 24a near the boundary between the effective pixel region 19 and the OPB pixel region 20.

Further, depths of the straight groove portions 24 other than the first straight groove portion 24a, that is, a second straight groove portion 24b and the third straight groove portion 24c are the same as each other. Further, the insulating film 13 is embedded in the second straight groove portion 24b and the third straight groove portion 24c. That is, the light shielding material 25 is embedded only in the first straight groove portion 24a, and is not embedded in the straight groove portions 24 (the second straight groove portion 24b and the third straight groove portion 24c) other than the first straight groove portion 24a.

Here, in the first embodiment, because the depth of the first straight groove portion 24a is larger than the depth of the third straight groove portion 24c, a dark current generated at an interface between the first straight groove portion 24a and the photoelectric conversion unit 17 of the effective pixel region 19 is made higher than a dark current generated at an interface between the third straight groove portion 24c and the photoelectric conversion unit 17. Therefore, it is not possible to use a pixel signal obtained from the photoelectric conversion unit 17 of the effective pixel region 19 adjacent to the OPB pixel region 20. That is, the pixels 9 in the effective pixel region 19 adjacent to the OPB pixel region 20 are pixels that cannot be used. Similarly, the pixels 9 in the OPB pixel region 20 adjacent to the effective pixel region 19 are also pixels that cannot be used.

In the first embodiment, an example in which a shape (depth) of the first straight groove portion 24a differs from a shape (depth) of the third straight groove portion 24c has been illustrated, but other configurations can be adopted. For example, a shape of first straight groove portions 24a or any one straight groove portion 24 (hereinafter also referred to as a "specific straight groove portion 26") among the plurality of second straight groove portions 24b formed in the OPB pixel region 20 and being parallel to the boundary between the effective pixel region 19 and the OPB pixel region 20 in a plan view among the plurality of straight groove portions 24 constituting the trench portion 23 may differ from a shape of the third straight groove portion 24c.

Figure 3:
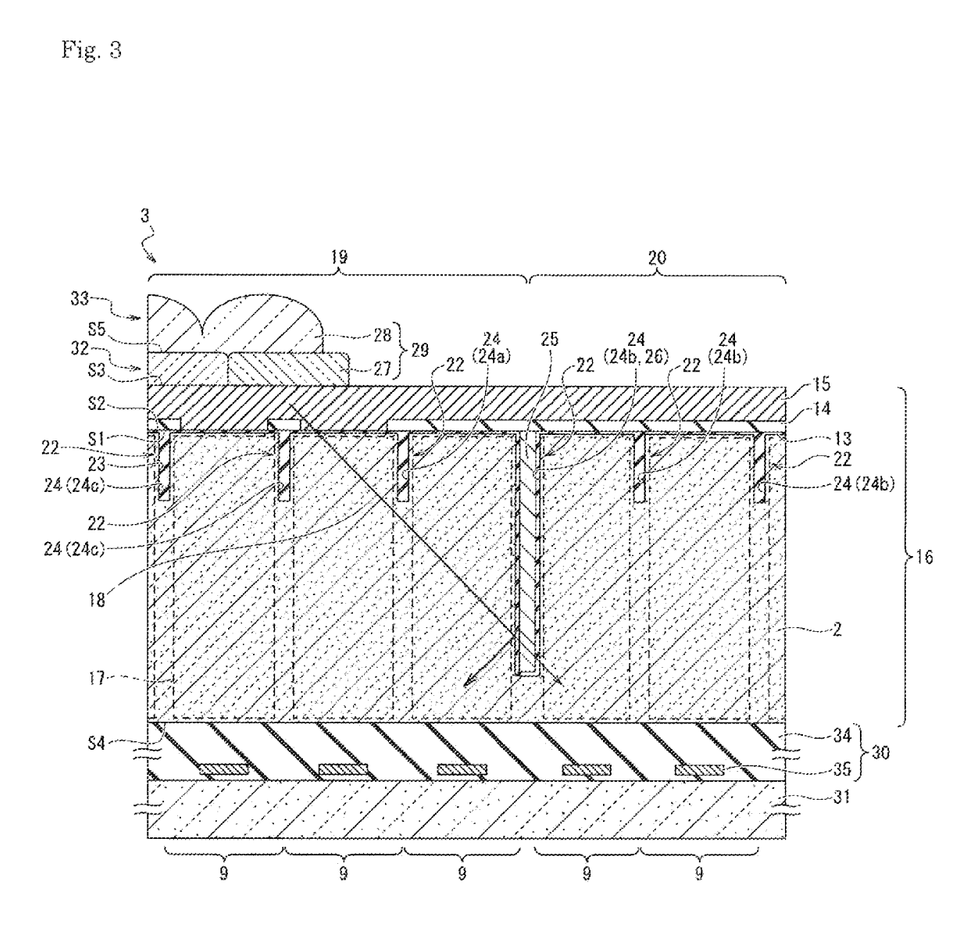
FIG. 3 is a diagram illustrating a cross-sectional configuration of a pixel region according to a modification example.

Specifically, the specific straight groove portion 26 may be configured not to include the first straight groove portion 24a but to include only one of the plurality of second straight groove portions 24b, as illustrated in FIG. 3. In this case, the depth of the first straight groove portion 24a is the same as the depth of the third straight groove portion 24c (the straight groove portion 24 of the effective pixel region 19).

This makes it possible for the dark current generated at the interface between the first straight groove portion 24a and the photoelectric conversion unit 17 of the effective pixel region 19 to be substantially the same as the dark current generated at the interface between the third straight groove portion 24c and the photoelectric conversion unit 17 of the effective pixel region 19. Therefore, it is possible to use the pixel signal obtained from the photoelectric conversion unit 17 of the effective pixel region 19 adjacent to the OPB pixel region 20, similar to the pixel signal obtained from the photoelectric conversion unit 17 of the effective pixel region 19 not adjacent to the boundary. That is, the pixels 9 in the effective pixel region 19 adjacent to the OPB pixel region 20 are available pixels. As a result, reduction in size of the effective pixel region 19 can be prevented. FIG. 3 illustrates a case in which the second straight groove portion 24b closest to the first straight groove portion 24a is the specific straight groove portion 26.

Figure 4:
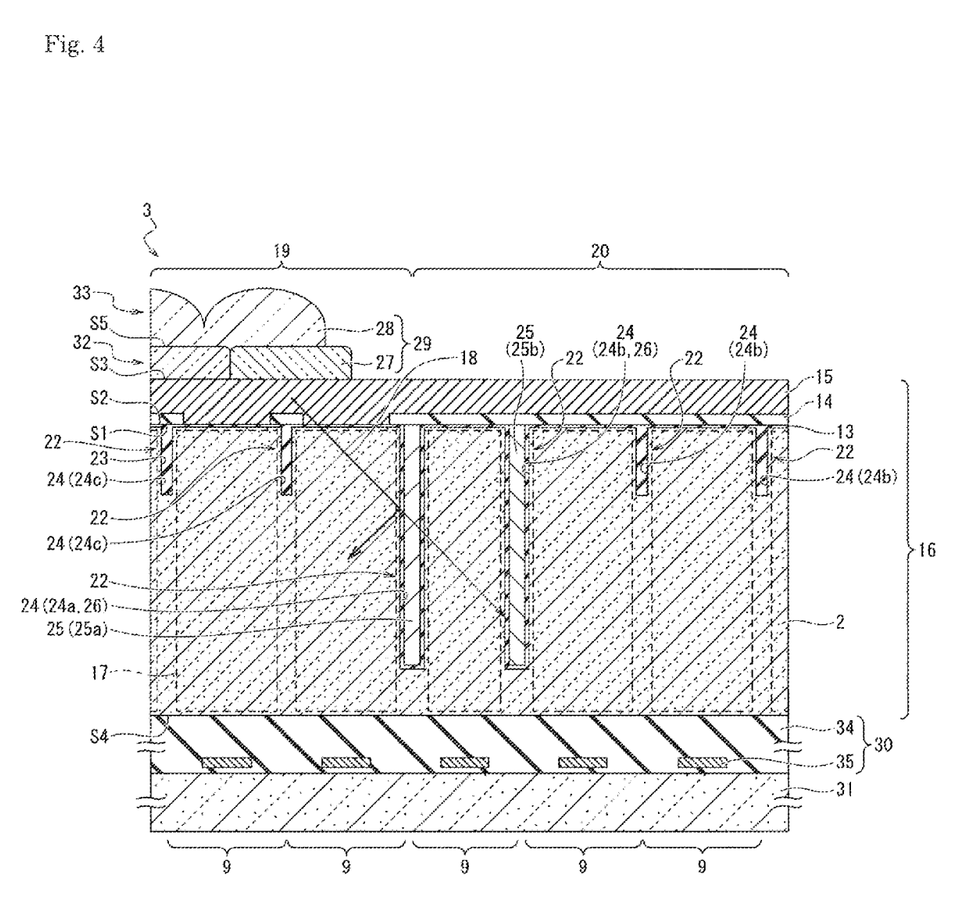
FIG. 4 is a diagram illustrating a cross-sectional configuration of a pixel region according to a modification example.

Further, for example, the specific straight groove portion 26 may be configured to be the first straight groove portion 24a and any two or more of the plurality of second straight groove portions 24b, as illustrated in FIG. 4. This makes it possible to further weaken the incident light 18 passing through the effective pixel region 19 and entering the OPB pixel region 20, and to reduce the number of pixels 9 that cannot be used for acquisition of a reference signal at an optical black level. In FIG. 4, a case in which the first straight groove portion 24a and the second straight groove portion 24b closest to the first straight groove portion 24a constitute the specific straight groove portion 26 is illustrated. Further, in FIG. 4, a case in which a width of the photoelectric conversion unit 17 (the pixel 9) of the OPB pixel region 20 adjacent to the specific straight groove portion 26 is narrowed when the two specific straight groove portions 26 (wide groove portions) are provided is illustrated.

When there are two or more specific straight groove portions 26, for example, the light shielding material 25 embedded in the specific straight groove portion 26 closest to the effective pixel region 19 may be a first material 25a that reflects light, and the light shielding material 25 embedded in the other specific straight groove portion 26 may be a second material 25b that absorbs light. As the first material 25a, for example, aluminum (Al) or ruthenium (Ru) can be adopted. Further, as the second material 25b, for example, tungsten (W) or titanium (Ti) can be adopted. This makes it possible to reflect the incident light 18 passing through the effective pixel region 19 and entering the OPB pixel region 20 to the effective pixel region 19, and curb reduction of charge generated in the photoelectric conversion unit 17 of the effective pixel region 19 adjacent to the OPB pixel region 20. Further, it is possible to prevent reflection of the incident light 18 passing through the specific straight groove portion 26 closest to the effective pixel region 19 and entering the OPB pixel region 20, and to curb an increase in charge generated in the photoelectric conversion unit 17 of the OPB pixel region 20 by the reflected incident light 18.

Incidentally, for example, in a method in which the light shielding material 25 of the specific straight groove portion 26 closest to the effective pixel region 19 is the second material 25b, the charge generated in the photoelectric conversion unit 17 of the effective pixel region 19 adjacent to the OPB pixel region 20 is reduced. Further, for example, in a method in which the light shielding material 25 of the other specific straight groove portion 26 is the first material 25a, the incident light 18 passing through the specific straight groove portion 26 closest to the effective pixel region 19 and entering the OPB pixel region 20 is reflected, and the charge generated in the photoelectric conversion unit 17 of the OPB pixel region 20 by the reflected incident light 18 is increased.

Further, in the first embodiment, for example, the width of the specific straight groove portion 26 is larger than the width of the third straight groove portion 24c, in addition to increasing a depth of the specific straight groove portion 26, as illustrated in FIG. 2A. Further, for example, the depth of the specific straight groove portion 26 may not be increased, and only the width of the specific straight groove portion 26 may be increased (may be larger than the width of the third straight groove portion 24c). This makes it possible to further improve a light shielding property of the specific straight groove portion 26, and to more reliably weaken the incident light 18 that enters the OPB pixel region 20 through the specific straight groove portion 26. Further, it becomes easy for the light shielding material 25 to be embedded in the specific straight groove portion 26, and voids can be prevented from being generated in the light shielding material 25. In particular, the first embodiment is suitable for a solid-state imaging device 1 in which the photoelectric conversion unit 17 is deep (the substrate 2 is thick) and the trench portion 23 is deeply formed in order to detect infrared (IR) rays. Further, because the width of only the specific straight groove portion 26 is increased, warping of the substrate 2 can be curbed. In FIG. 2A, a case in which the width of the photoelectric conversion unit 17 (the pixel 9) of the OPB pixel region 20 adjacent to the specific straight groove portion 26 is decreased when the width of the specific straight groove portion 26 is increased is illustrated.

Incidentally, for example, according to a method of increasing a width of all the straight groove portions 24 constituting the trench portion 23, a width of the straight groove portion 24 on the opening side is widened and the substrate 2 is warped. Further, an area of the photoelectric conversion unit 17 on the light reception surface side becomes small, and sensitivity of the photoelectric conversion unit 17 is degraded.

The insulating film 13 continuously covers a side wall surface and a bottom surface of the straight groove portion 24, and the entire back surface S1 (the entire light reception surface) of the substrate 2. The insulating film 13 may be configured by stacking, for example, a large number of fixed charge films having negative charge capable of generating fixed charge and strengthening pinning. The light shielding film 14 continuously covers an entire back surface S2 (an entire light reception surface) of the insulating film 13. Specifically, the light shielding film 14 is formed in a grid pattern so as to open the light reception surface of each photoelectric conversion unit 17 in the effective pixel region 19. Further, in the OPB pixel region 20, there is no opening corresponding to the light reception surface of the photoelectric conversion unit 17, and light is completely shielded. As the material of the light shielding film 14, for example, a metal such as aluminum (Al), tungsten (W), or copper (Cu) can be adopted. The flattening film 15 continuously covers the entire back surface S2 (entire light reception surface) of the insulating film 13 including the light shielding film 14. Accordingly, a back surface S1 of the light reception layer 16 is a flat surface without unevenness. As a material of the flattening film 15, for example, an organic material such as a resin can be used.

Further, in the solid-state imaging device 1 of the first embodiment, a condensing layer 29 in which a color filter 27 and a microlens 28 (an on-chip lens) are stacked in this order is formed in a portion corresponding to the effective pixel region 19 on a surface of the light reception layer 16 on the flattening film 15 side (hereinafter also referred to as a "back surface S3"). Further, a wiring layer 30 and a support substrate 31 are stacked in this order on the whole of a surface of the light reception layer 16 on the substrate 2 side (hereinafter also referred to as a "surface S4").

The color filter 27 is formed on the back surface S3 side (light reception surface side) of the flattening film 15 in correspondence to each photoelectric conversion unit 17. That is, one color filter 27 is formed for one photoelectric conversion unit 17. Accordingly, the color filters 27 form a color filter array 32 in which the color filters 27 are regularly arranged in a two-dimensional array pattern. Each of the color filters 27 is configured to transmit a specific wavelength of the incident light 18 to be received by each photoelectric conversion unit 17 for, for example, red R, green G, and blue B, and cause the transmitted incident light 18 to be incident on the photoelectric conversion unit 17.

The microlens 28 is formed in correspondence to each photoelectric conversion unit 17 on the back surface S5 side (light reception surface side) of the color filter 27. That is, one microlens 28 is formed for one photoelectric conversion unit 17. Accordingly, the microlenses 28 form a microlens array 33 in which the microlenses 28 are regularly arranged in a two-dimensional array pattern. Each of the microlenses 28 is configured to condense the image light (the incident light 18) from the subject and guide the condensed incident light 18 to the vicinity of a back surface (a light reception surface) of the photoelectric conversion unit 17 via the color filter 27.

The wiring layer 30 is formed on the surface S4 side of the substrate 2, and includes an interlayer insulating film 34, and a wiring 35 stacked in a plurality of layers via the interlayer insulating film 34. The wiring layer 30 drives pixel transistors constituting each pixel 9 via the wiring 35 in the plurality of layers. The support substrate 31 is formed on a surface of the wiring layer 30 opposite to a side facing the substrate 2. The support substrate 31 is a substrate for securing strength of the substrate 2 in a manufacturing stage of the solid-state imaging device 1. As a material of the support substrate 31, for example, silicon (Si) can be used.

As described above, in the solid-state imaging device 1 of the first embodiment, the first straight groove portion 24a formed at the boundary between the effective pixel region 19 and the optical black pixel region 20 (the OPB pixel region 20), and the specific straight groove portion 26 that is any one of the plurality of second straight groove portions 24b formed in the OPB pixel region 20 and parallel to the boundary in a plan view among the plurality of straight groove portions 24 constituting the trench portion 23, have a different shape from the third straight groove portion 24c formed between the photoelectric conversion units 17 in the effective pixel region 19, and the light shielding material 25 embedded therein. Accordingly, for example, a shape of the specific straight groove portion 26 is a shape more excellent in a light shielding property than the shape of the third straight groove portion 24c, making it possible to weaken the incident light 18 entering the OPB pixel region 20 through the effective pixel region 19 using the pixel separation portion 22 configured by the specific straight groove portion 26 near the boundary between the effective pixel region 19 and the OPB pixel region 20. Therefore, the number of rows of the photoelectric conversion units 17 (the pixels 9) in the OPB pixel region 20 at which the incident light 18 from the effective pixel region 19 arrives can be reduced. That is, the number of rows of the pixels 9 (ineffective pixels 9) that cannot be used for acquisition of the reference signal at an optical black level can be reduced. Specifically, 10 to 20 rows of the ineffective pixels 9 arranged between the effective pixel region 19 and the OPB pixels 9 (the pixels 9 used for acquisition of the reference signal) have been required in the related art, but there can be two or three rows of the ineffective pixels 9. As a result, the OPB pixel region 20 is reduced such that a chip area can be reduced and the manufacturing cost can be reduced. Alternatively, the effective pixel region 19 can be expanded by an amount of reduction of the OPB pixel region 20 while maintaining the chip area.

2. Second Embodiment: Solid-State Imaging Device

[2-1 Configuration of Main Portions]

Figure 5:
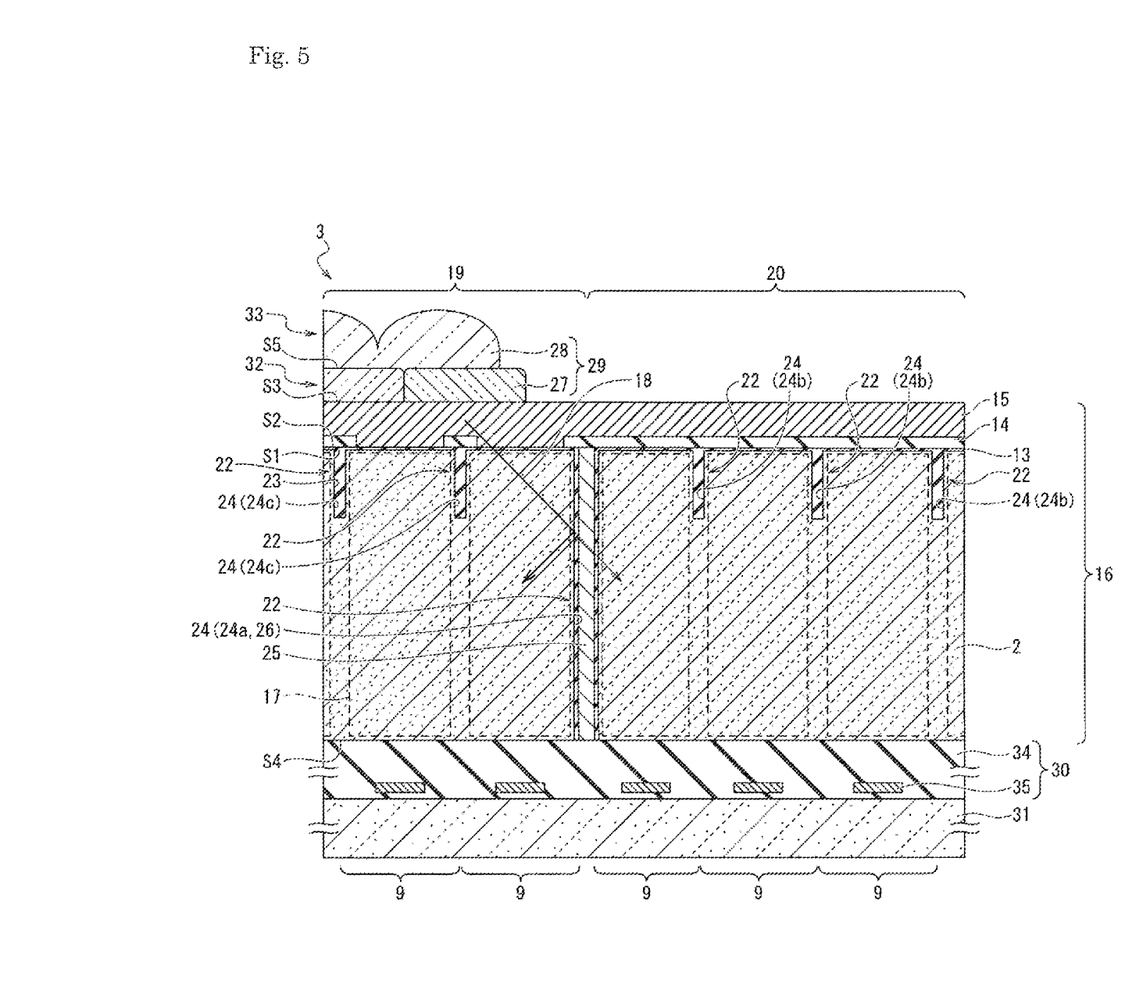
FIG. 5 is a diagram illustrating a cross-sectional configuration of a pixel region according to a second embodiment.

Next, a solid-state imaging device 1 according to a second embodiment of the present disclosure will be described. Because an overall configuration of the solid-state imaging device according to the second embodiment is the same as that in FIG. 1, the illustration is omitted. FIG. 5 is a cross-sectional configuration diagram of main portions of the solid-state imaging device 1 according to the second embodiment. In FIG. 5, portions corresponding to those in FIG. 2A are denoted by the same reference signs, and repeated description will be omitted.

The solid-state imaging device 1 according to the second embodiment has a pixel separation portion 22 having a different configuration from that in the solid-state imaging device 1 according to the first embodiment. In the second embodiment, each of a plurality of straight groove portions 24 (a first straight groove portion 24a, second straight groove portions 24b, third straight groove portions 24c) constituting the trench portion 23 is formed to penetrate the substrate 2, as illustrated in FIG. 5. That is, depths of all the straight groove portions 24 are the same. Further, the width of the specific straight groove portion 26 is larger than the width of the third straight groove portion 24c. In FIG. 5, a configuration in which the first straight groove portion 24a is the specific straight groove portion 26 is illustrated. Further, the light shielding material 25 is embedded only in the specific straight groove portion 26, and is not embedded in the straight groove portion 24 other than the specific straight groove portion 26.

As described above, in the solid-state imaging device 1 of the second embodiment, each of the plurality of straight groove portions 24 is formed so as to penetrate the substrate 2, and the width of the specific straight groove portion 26 is larger than the width of the third straight groove portion 24c. This makes it possible to further improve a light shielding property of the specific straight groove portion 26, and to more reliably weaken the incident light 18 that enters the OPB pixel region 20 through the specific straight groove portion 26. Further, it becomes easy for the light shielding material 25 to be embedded inside the specific straight groove portion 26, and it is possible to prevent voids from being generated in the light shielding material 25. Further, because the width of only the specific straight groove portion 26 is increases, it is possible to curb warping of the substrate 2.

Incidentally, for example, according to a method of increasing a width of all the straight groove portions 24 constituting the trench portion 23, a width of the straight groove portion 24 on the opening side is widened and the substrate 2 is warped. Further, an area of the photoelectric conversion unit 17 on the light reception surface side becomes small, and sensitivity of the photoelectric conversion unit 17 is degraded.

Further, in the solid-state imaging device 1 of the second embodiment, because the depths of all the straight groove portions 24 are the same, the dark current generated at the interface between the first straight groove portion 24a and the photoelectric conversion unit 17 of the effective pixel region 19 is made about the same as the dark current generated at an interface between the third straight groove portion 24c and the photoelectric conversion unit 17. Therefore, it is possible to use the pixel signal obtained from the photoelectric conversion unit 17 of the effective pixel region 19 adjacent to the OPB pixel region 20. That is, the pixels 9 in the effective pixel region 19 adjacent to the OPB pixel region 20 are the pixels 9 that can be used for acquisition of a pixel signal (hereinafter also referred to as "effective pixels 9"). As a result, it is possible to increase the number of effective pixels 9 while maintaining the effective pixel region 19.

[2-2 Modification Example]

Figure 6A:
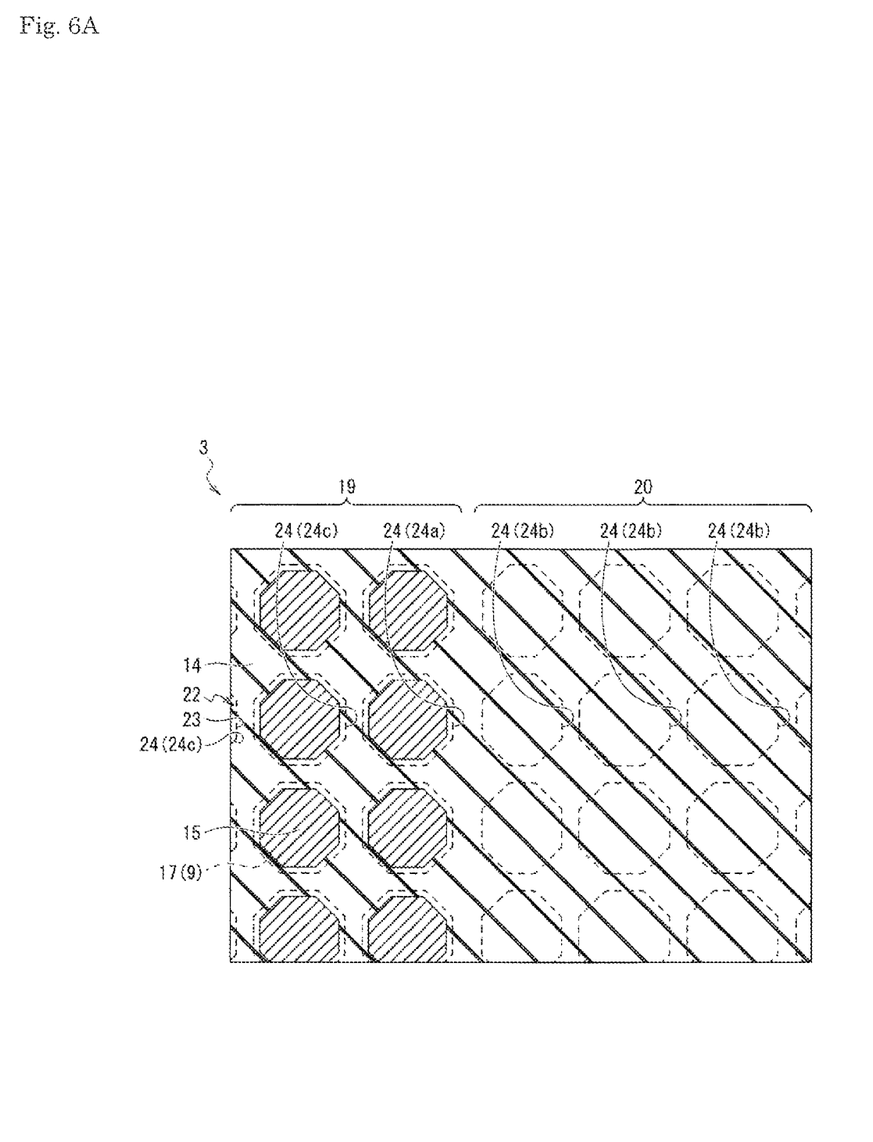
FIG. 6A is a diagram illustrating a shape of a photoelectric conversion unit according to a modification example.
Figure 6B:
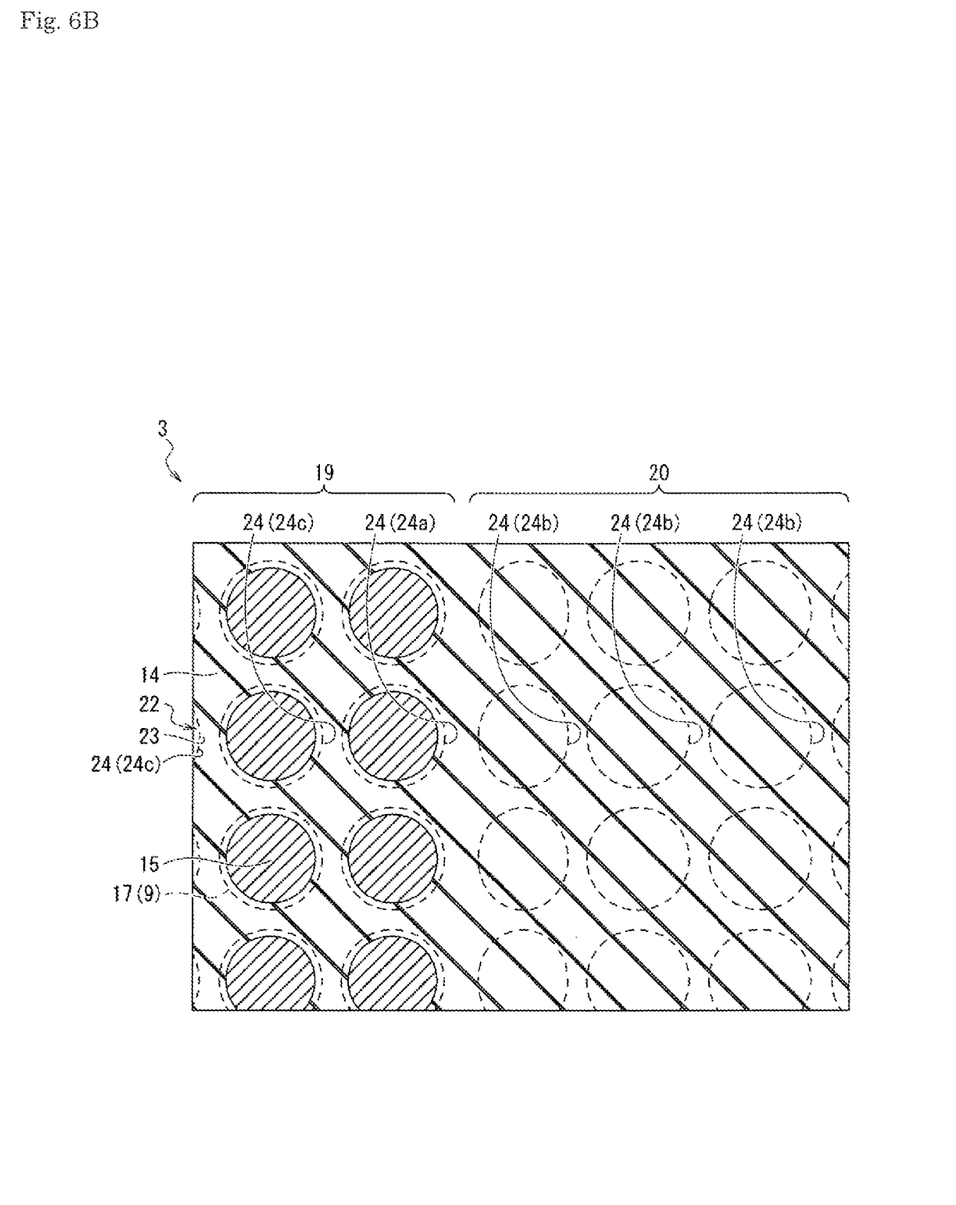
FIG. 6B is a diagram illustrating a shape of the photoelectric conversion unit according to the modification example.

Although an example in which a shape of the photoelectric conversion unit 17 on the light reception surface side is a quadrangle has been shown in the first embodiment and the second embodiment, other configurations can also be adopted. For example, the shape may be an octagon as illustrated in FIG. 6A, or may be a circle as illustrated in FIG. 6B. When the shape of the photoelectric conversion unit 17 on the light reception surface side is an octagon or circle, the side surface of the straight groove portion 24 constituting the trench portion 23 has a shape having unevenness along the side surface of the octagonal or circular photoelectric conversion unit 17.

3. Example of Application to Electronic Device

The technology according to the present disclosure (the present technology) may be applied to various electronic devices, such as an imaging device such as a digital still camera and a digital video camera, a mobile phone having an imaging function, or other devices having an imaging function.

FIG. 7 is a diagram illustrating an example of a schematic configuration of an electronic device (for example, a camera) to which the technology according to the present disclosure (the present technology) can be applied.

As illustrated in FIG. 7, an electronic device 100 includes a solid-state imaging device 101, an optical lens 102, a shutter device 103, a drive circuit 104, and a signal processing circuit 105.

The optical lens 102 forms an image of image light (incident light 106) from a subject on an imaging surface of the solid-state imaging device 101. Accordingly, the signal charge is accumulated in the solid-state imaging device 101 for a certain period of time. The shutter device 103 controls a light irradiation period and a light blocking period for the solid-state imaging device 101. The drive circuit 104 supplies a drive signal for controlling a transfer operation of the solid-state imaging device 101 and a shutter operation of the shutter device 103. Signal transfer of the solid-state imaging device 101 is performed by the drive signal (timing signal) supplied from the drive circuit 104. The signal processing circuit 105 performs various signal processing on a signal (pixel signal) output from the solid-state imaging device 101. A video signal subjected to the signal processing is stored in a storage medium such as a memory or output to a monitor.

The electronic device 100 to which the solid-state imaging device 1 can be applied is not limited to the camera, but the solid-state imaging device 1 can also be applied to other electronic devices. For example, the solid-state imaging device 1 may be applied to an imaging device such as a camera module for a mobile device such as a mobile phone or a tablet terminal.

An example of the electronic device to which the technology according to the present disclosure can be applied has been described. The technology according to the present disclosure can be applied to the solid-state imaging device 101 among the configurations described above. Specifically, the solid-state imaging device 1 of FIG. 1 can be applied to the solid-state imaging device 101. It is possible to obtain a better photographed image by applying the technology according to the present disclosure to the solid-state imaging device 101.

The present technology can have the following configurations.

(1)

A solid-state imaging device, including:
a pixel region formed on a substrate and including a plurality of photoelectric conversion units arranged in an array pattern; and
a pixel separation portion including a trench portion formed in a grid pattern between the photoelectric conversion units,
wherein the pixel region is partitioned into an effective pixel region including the photoelectric conversion units for obtaining a pixel signal corresponding to incident light, and
an optical black pixel region adjacent to the effective pixel region, the optical black pixel region including a light reception surface side covered with a light shielding film, and the photoelectric conversion unit for obtaining a reference signal at an optical black level, and
among a plurality of straight groove portions constituting the trench portion, a first straight groove portion is formed at a boundary between the effective pixel region and the optical black pixel region, a plurality of second straight groove portions are formed in the optical black pixel region and parallel to the boundary in a plan view, and a third straight groove portion is formed between the pixels in the effective pixel region,
a specific straight groove portion, the specific straight groove portion being the first straight groove portion and/or being one or more of the plurality of second straight groove portions, has a different shape from the third straight groove portion, and a light shielding material is embedded in the specific straight groove portion.

(2)

The solid-state imaging device according to (1),
wherein a depth of the specific straight groove portion is larger than a depth of the third straight groove portion.

(3)

The solid-state imaging device according to (2),
wherein the specific straight groove portion does not include the first straight groove portion, but includes only one of the plurality of second straight groove portions.

(4)

The solid-state imaging device according to any one of (1) to (3),
wherein a width of the specific straight groove portion is larger than a width of the third straight groove portion.

(5)

The solid-state imaging device according to (1), wherein each of the plurality of straight groove portions is formed so as to penetrate the substrate, and a width of the specific straight groove portion is larger than a width of the third straight groove portion.

(6)

The solid-state imaging device according to any one of (1) to (5), wherein the specific straight groove portion includes the first straight groove portion, and any two or more of the plurality of second straight groove portions.

(7)

The solid-state imaging device according to (6), wherein the light shielding material embedded in the specific straight groove portion closest to the effective pixel region is a first material for reflecting light, and the light shielding material embedded in the other specific straight groove portion is a second material for absorbing light.

(8)

The solid-state imaging device according to any one of (1) to (6), wherein the light shielding material is aluminum, tungsten, or copper.

(9)

An electronic device including:
a solid-state imaging device including a pixel region formed on a substrate and including a plurality of photoelectric conversion units arranged in an array pattern, and a pixel separation portion including a trench portion formed in a grid pattern between the photoelectric conversion units, the pixel region being partitioned into an effective pixel region including the photoelectric conversion units for obtaining a pixel signal corresponding to incident light, and an optical black pixel region adjacent to the effective pixel region, the optical black pixel region including a light reception surface side covered with a light shielding film, and the photoelectric conversion unit for obtaining a reference signal at an optical black level, and among a plurality of straight groove portions constituting the trench portion, a first straight groove portion is formed at a boundary between the effective pixel region and the optical black pixel region, a plurality of second straight groove portions are formed in the optical black pixel region and parallel to the boundary in a plan view, and a third straight groove portion is formed between the pixels in the effective pixel region, a specific straight groove portion, the specific straight groove portion being the first straight groove portion and/or being one or more of the plurality of second straight groove portions, has a different shape from the third straight groove portion, and a light shielding material is embedded in the specific straight groove portion;

an optical lens configured to form an image of image light from a subject on an imaging surface of the solid-state imaging device; and a signal processing circuit configured to perform signal processing on a signal output from the solid-state imaging device.

REFERENCE SIGNS LIST

1 Solid-state imaging device
2 Substrate
3 Pixel region
4 Vertical drive circuit
5 Column signal processing circuit
6 Horizontal drive circuit
7 Output circuit
8 Control circuit
9 Pixel (effective pixel, OPB pixel)
10 Pixel drive wiring
11 Vertical signal line
12 Horizontal signal line
13 Insulating film
14 Light shielding film
15 Flattening film
16 Light reception layer
17 Photoelectric conversion unit
18 Incident light
19 Effective pixel region
20 Optical black pixel region (OPB pixel region)
21a, 21b, 21c, 21d Pixel column
22 Pixel separation portion
23 Trench portion
24 Straight groove portion
24a First straight groove portion
24b Second straight groove portion
24c Third straight groove portion
25 Light shielding material
25a First material
25b Second material
26 Specific straight groove portion
27 Color filter
28 Microlens
29 Condensing layer
30 Wiring layer
31 Support substrate
32 Color filter array
33 Microlens array
34 Interlayer insulating film
35 Wiring
100 Electronic device
101 Solid-state imaging device
102 Optical lens
103 Shutter device
104 Drive circuit
105 Signal processing circuit
106 Incident light

What is claimed is:

1. A solid-state imaging device, comprising:
a substrate region, including an effective pixel region and a region outside of the effective pixel region, wherein the effective pixel region includes a plurality of photoelectric conversion units for obtaining a pixel signal corresponding to incident light,
wherein a plurality of first groove portions are formed between the photoelectric conversion units in the effective pixel region,
wherein the region outside of the effective pixel region is between an edge of the substrate region and the effective pixel region,
wherein the region outside of the effective pixel region includes a plurality of second groove portions, and
wherein a length of the plurality of second groove portions in a thickness direction of the substrate region in a cross-sectional view is longer than a length of the plurality of first groove portions in the thickness direction of the substrate region in the cross-sectional view.

2. The solid-state imaging device according to claim 1, wherein a width of at least one of the second groove portions is larger than a width of the first groove portions.

3. The solid-state imaging device according to claim 1, wherein at least one of the second groove portions is formed so as to penetrate the substrate, and a width of the at least one of the second groove portions is larger than a width of the first groove portions.

4. The solid-state imaging device according to claim 1, wherein a light shielding material embedded in at least a first one of the second groove portions closest to the effective pixel region is a first material for reflecting light, and a light shielding material embedded in at least a second one of the second groove portions is a second material for absorbing light.

5. The solid-state imaging device according to claim 4, wherein the light shielding material is aluminum, tungsten, or copper.

6. An electronic device, comprising:
a solid-state imaging device including:
a substrate region including an effective a pixel region and a region outside of the effective pixel region, wherein the effective pixel region includes a plurality of photoelectric conversion units for obtaining a pixel signal corresponding to incident light, wherein a plurality of first groove portions are formed between the photoelectric conversion units in the effective pixel region,
wherein the region outside of the effective pixel region is between an edge of the substrate region and the effective pixel region,
wherein the region outside of the effective pixel region includes a plurality of second groove portions, and
wherein a length of the plurality of second groove portions in a thickness direction of the substrate region in a cross-sectional view is longer than a length of the plurality of first groove portions in the thickness direction of the substrate region in a cross-sectional view;

an optical lens configured to form an image of image light from a subject on an imaging surface of the solid-state imaging device; and a signal processing circuit configured to perform signal processing on a signal output from the solid-state imaging device.

7. The solid-state imaging device according to claim 1, wherein the region outside of the effective pixel region is adjacent the effective pixel region.

8. The solid-state imaging device according to claim 1, wherein the substrate region consists of the effective pixel region and the region outside of the effective pixel region.

* * * * *